United States Patent [19]

Mito et al.

[11] 4,318,058
[45] Mar. 2, 1982

[54] SEMICONDUCTOR DIODE LASER ARRAY

[75] Inventors: Ikuo Mito; Shigeo Matsushita; Kohroh Kobayashi, all of Tokyo, Japan

[73] Assignee: Nippon Electric Co., Ltd., Tokyo, Japan

[21] Appl. No.: 142,743

[22] Filed: Apr. 22, 1980

[30] Foreign Application Priority Data

| Apr. 24, 1979 | [JP] | Japan | 54-49814 |
| May 18, 1979 | [JP] | Japan | 54-61996 |
| May 18, 1979 | [JP] | Japan | 54-61997 |
| Jun. 8, 1979 | [JP] | Japan | 54-71110 |

[51] Int. Cl.$^3$ ............................................. H01S 3/19
[52] U.S. Cl. ................................... 372/50; 350/96.11; 357/17; 357/90
[58] Field of Search .............. 331/94.5 H; 357/17, 357/18, 90; 350/96.11

[56] References Cited

U.S. PATENT DOCUMENTS 4,199,385  4/1980  Hung et al. .................. 357/17 X
4,211,586  7/1980  Fang et al. ................... 357/17 X

OTHER PUBLICATIONS

A. Y. Cho, "Recent Developments in Molecular Beam Epitaxy (MBE)", *Journal of Vacuum Science & Technology*, vol. 16, No. 2, 1979, pp. 275–284.

K. Aiki et al., "Frequency Multiplexing Light Source With Monolithically Integrated Distributed-Feedback Diode Lasers", *APL*, vol. 29, No. 8, 15 Oct. 1976, pp. 506–508.

A. P. Bogatov et al., "Radiative Characteristics of In-P-GaInPAs Laser Heterostructures", *Sov. Phys. Semicond.*, vol. 9, No. 10, pp. 1282–1285.

M. B. Panish, "Phase Equilibria in the System Al-Ga-As-Sn and Electrical Properties of Sn-Doped Liquid Phase Epitaxial $Al_xGa_{1-x}As$", *J. Appl. Phys.*, vol. 44, No. 6, Jun. 1973, pp. 2667–2675.

*Primary Examiner*—James W. Davie
*Attorney, Agent, or Firm*—Hopgood, Calimafde, Kalil, Blaustein & Judlowe

[57] ABSTRACT

An integrated laser array is disclosed in which a plurality of semiconductor lasers are integrated on a semiconductor multi-layer crystal that includes an active layer in which the band gap energy varies in one direction. By means of this arrangement a plurality of semiconductor lasers, which differ in their respective oscillating wavelengths over a relatively broad range, can be formed on a common substrate.

7 Claims, 17 Drawing Figures

SEMICONDUCTOR DIODE LASER ARRAY

The present invention relates generally to a semiconductor light-emitting element, and more particularly to a multi-wavelength oscillating semiconductor laser array consisting of integrated semiconductor lasers.

Qualitative improvement has been made in optical semiconductor elements and optical fibers in recent years, resulting in significant advances in practical optical fiber communication. Optical fiber communication systems include the optical fiber wavelength-division multiplex transmission systems by which a plurality of light beams of different wavelengths are multiplexly transmitted over a single optical fiber. These systems, which are optical counterparts of the frequency-division multiplex transmission system in electrical communications, are noted for their capability to effectively utilize the usable wavelength range and their flexibility of system operation, as well as the expansion of applicable areas that can be attained by their use. The extensive use of optical multiplex communications systems not only in trunk communication but also in community antenna television (CATV), industrial television (ITV), and on computer data buses is contemplated, and active research and development efforts are being made for these purposes.

The composition of an optical fiber wavelength-division multiplex transmission system requires a plurality of light sources having different wavelengths. Since light sources for this purpose previously used elements which were prepared under different crystal growth conditions to achieve the required different wavelengths, they inevitably required many manhours to produce. In an attempt to provide light sources for use in wavelength multiplex communication, which were free from this disadvantage a plurality of distributed-feedback semiconductor lasers formed on the same substrate have been developed. This device is realized by forming a plurality of periodic structures having different periods in a part of a multi-layered structure which is uniform in crystalline composition whereby a plurality of semiconductor lasers differing in wavelength are integrated on the same substrate. For details on this device, reference is made to an article by K. Aiki et al. in Applied Physics Letters, Vol. 29, No. 8, Oct. 15, 1976, pp. 506–508. This semiconductor laser device has many advantages including the stabilization of wavelengths by their distributed-feedback control and the substantial reduction in manhours required for their production through the integration of lasers on the same substrate.

However, since the wavelength range in which semiconductor crystals have a sufficient gain is not so wide for any given crystalline composition, it is virtually impossible to integrate a plurality of semiconductor lasers over a wide wavelength range in a conventional semiconductor laser device having active layers of the same crystalline composition. For example, in the aforementioned conventional semiconductor laser device, in which six lasers are integrated, has a range of oscillating wavelengths extending over at most 120 Å. In view of the variability of oscillating wavelengths with changes in ambient temperature and other factors, the wavelength intervals between adjoining channels should not be narrower than a certain limit. Therefore, an increase in multiplicity can not be expected in the conventional semiconductor laser device.

Moreover, wavelength multiplex communication systems require, besides these multi-wavelength light sources, an optical multiplexing device for combining the light rays of all the wavelengths used into a single optical fiber. A plurality of light sources, which differ in wavelength, and an optical multiplexing device integrated on the same substrate has been conceived as being a desirable form of such a system. In one example of such an arrangement, as described in the article by Aiki et al. referred to above, the output light beams from the six distributed-feedback laser diodes (DFB LDs) are guided to the same launching terminal by way of waveguides formed on the same substrate. The six output light beams are wavelength-multiplexed and combined into a single optical fiber without needing any optical wavelength-multiplexing means such as prisms or focusing rod lenses. To reduce the absorption loss, the waveguide layer of this element consists of an $Al_{0.1}Ga_{0.9}As$ layer composed by etching an $Al_xGa_{1-x}As$ multi-layer substrate and again epitaxially growing it. Thus, including the step of epitaxial growing after the formation of the diffraction grating on the $Al_xGa_{1-x}As$ substrate, the whole production process of this element involves two epitaxial growing steps, inviting such disadvantages as a decrease in the yield of element production and an increase in the number of manhours required for the production process, which make this an impractical device.

Accordingly, it is an object of the present invention to provide a multi-wavelength semiconductor laser array in which a plurality of semiconductor lasers having different wavelengths over a wide range of wavelengths are integrated on the same substrate.

It is a further object of the invention to provide a multi-wavelength semiconductor laser array which is composed by integrating on the same substrate a plurality of semicondutor lasers having different wavelengths over a wide range of wavelengths and an optical multiplexing device for multiplexing the output light rays therefrom, and which can be manufactured in a simple process.

According to the present invention, there is provided a monolithically integrated laser array capable of providing light rays of a plurality of wavelengths. The array comprises a semiconductor body having a semiconductor substrate and a multi-layer structure formed on the substrate. The multi-layer structure includes an active layer, a first cladding layer, and a second cladding layer separated from one another by the active layer. The active layer is being composed of a mixed crystal varying an energy band gap in a predetermined direction of a plane lying in the active layer. Means are provided to electrically isolate the multi-layer structure in parallel to another direction perpendicular to the predetermined direction and to provide a plurality of laser diodes. The isolating means reaches the first cladding layer through the active and cladding layers, and a voltage is supplied to forward bias each of the laser diodes.

This invention, according to which each laser element has as its active layer a semiconductor layer having a different energy bandgap from those of all others, permits the oscillating wavelengths of the laser elements to be sufficiently distant from one another. Since each laser element can oscillate at the wavelength of its optimum gain, the oscillation efficiency of the array of the invention is remarkably high.

Before describing the multi-wavelength semiconductor laser array according to the present invention, it will be useful to briefly explain the characteristics of $Al_xGa_{1-x}As$ and $In_yGa_{1-y}As_zP_{1-z}$ compound semiconductors. First, both GaAs and AlAs crystals are semiconductors belonging to a binary compound of Group III-V materials and to the crystalline system of the zinc-blende type, and their lattice constants are almost identical, 5.63 Å for the GaAs crystal and 5.66 Å for the AlAs crystal. Accordingly, in epitaxially growing the $Al_xGa_{1-x}As$, which is a mixed crystal of GaAs and AlAs, on a GaAs substrate, the problem of lattice mismatching can hardly occur, and a multi-layer film of $Al_xGa_{1-x}As$ can be formed on a GaAs substrate with comparative ease. The $In_yGa_{1-y}As_zP_{1-z}$ crystal, too, can be formed with comparative ease into a multi-layer film, in good lattice-matching with the InP crystal, on an InP substrate by choosing an appropriate combination of y and z. Thus far, $Al_xGa_{1-x}As$ and $In_yGa_{1-y}As_zP_{1-z}$ multi-layer films have been formed by such epitaxial growth techniques as liquid phase epitaxy (LPE), vapor phase epitaxy (VPE) and metal organic chemical vapor deposition (MOCVD), and processed into optical semiconductor elements as LED, LD, PD and APD. More recently, it has become possible to epitaxially grow such films on a substrate in a selective manner by molecular beam epitaxy (MBE). (Such a technique is described by A. Y. Cho in Journal of Vacuum Science & Technology, Vol. 16, No. 2, pp. 275-284 (1979).)

The band gap energies of the $Al_xGa_{1-x}As$ and $In_yGa_{1-y}As_zP_{1-z}$ compound semiconductors are known to vary with changes in the mixture ratios x, y and z of these crystals. As reported by M. B. Panish in Journal of Applied Physics, Vol. 44, No. 6, June 1973, pp. 2667-2675, the band gap energy Eg of the $Al_xGa_{1-x}As$ compound semiconductor monotonously increases as the mixture ratio x of AlAs rises in the range of $0 \leq x < 0.35$. In making an LD of an $Al_xGa_{1-x}As$ compound semiconductor, a double-hetero (DH) structure is used which effectively confines the carrier within the active layer by making the band gap energy of the active layer, which serves as light emitting section, smaller than those of the $Al_xGa_{1-x}As$ layers on both sides. On the other hand, the refractive index of an $Al_xGa_{1-x}As$ compound semiconductor decreases with an increase in band gap energy. Therefore, this DH structure also has a function of what is known as a light waveguide, which confines light in an active layer whose refractive index is greater than those of the $Al_xGa_{1-x}As$ layers on both sides.

The $In_yGa_{1-y}As_zP_{1-z}$ crystal has been reported on by A. P. Boyatov et al. in Soviet Physics Semiconductor, Vol. 9, No. 10, pp. 1282-1285. The DH structure of this crystal and its action are respectively the same as reported for $Al_xGa_{1-x}As$.

Features and advantages of the present invention will be more apparent from the following detailed decription taken in conjunction with the accompanying drawings, wherein.

Figure 1:
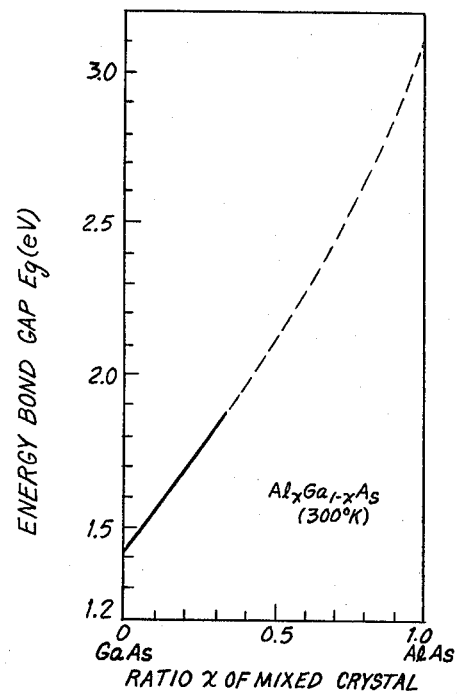
FIG. 1 is a graph illustrating the relationship between the crystal mixture ratio x of AlAs and the band gap energy in the $Al_xGa_{1-x}As$ compound semiconductor.

Referring to FIG. 1, which is similar to FIG. 1 of the paper by M. B. Panish referred to above, the band gap energy of an $Al_xGa_{1-x}As$ crystal monotonously increases and has a direct transition range of only about $0 \leq x < 0.35$, or from 1.43 eV to approximately 1.9 eV in terms of band gap energy. Although it is theoretically possible to obtain an LD having different wavelengths within the band gap energy range, in practice it is not efficient toward the shorter wavelength end of the range. Further, by doping such impurities as Ge into the active layer, a laser diode emitting light in a wavelength-equivalent range of approximately 900 nm to 700 nm can be realized.

Varying the crystal mixture ratio x of $Al_xGa_{1-x}As$ in the active layer as referred to above is tantamount to varying the light-emitting wavelength of the LD. Therefore, by using, in the film plane of the active layer, a double-hetero (DH) $Al_xGa_{1-x}As$ multi-layer film structure in which the crystal mixture ratio x of AlAs shows a uniform variation in the direction perpendicular to the cavity forming direction, a plurality of LDs differing in wavelength can be formed on the same substrate. Such an $Al_xGa_{1-x}As$ multi-layer film structure can be produced by the LPE, VPE, MBE or other technique.

Figure 2:
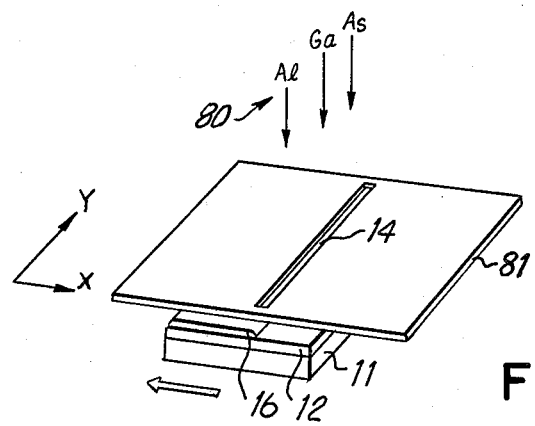
FIG. 2 illustrates the MBE process to produce an $Al_xGa_{1-x}As$ film in which the crystal mixture ratio x of AlAs varies in one direction (x)

FIG. 2 illustrates the MBE technique, which is one of several methods available to obtain such a multi-layer film structure. On an n-GaAs substrate 11 a sample is prepared by forming an $n-Al_{0.35}Ga_{0.65}As$ film 12, which will serve as a first cladding layer. The flim 12 is so set that it can be shifted in the direction indicated by the large arrow in the figure (the X direction). A covering mask 81 is provided, in the Y direction normal to the x direction, with a slit 14, through which the molecular beams of Al, Ga and As, collectively referred to by numeral 80, can pass downward. If the molecular beams 80 are generated in such a manner as will gradually increase the proportion of Al, and if the substrate 11 is shifted in the direction of the arrow, the epitaxial growth of an $Al_xGa_{1-x}As$ film 16 whose crystal mixture ratio x is uniform in the Y direction but gradually increases in the X direction, will selectively take place on the substrate.

Figure 3:
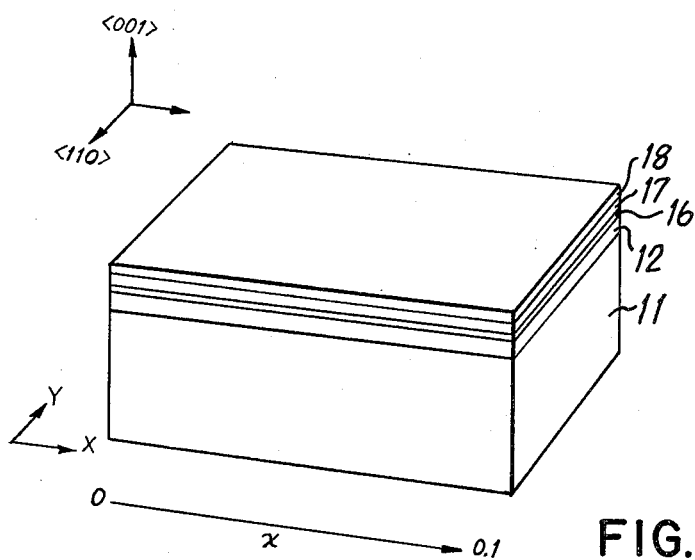
FIG. 3 is a perspective view of a DH structured $Al_xGa_{1-x}As$ multi-layer film in which the crystal mixture ratio x of AlAs varies in one direction in the film plane of the active layer illustrating a part of the production process in accordance with this invention.

Next, by using the film 16 obtained as described above and, with the mask taken off, overlaying a p-$Al_{0.35}Ga0.65As$ film 17, which will constitute a second cladding layer, and a p-GaAs film 18 on it, a DH $Al_x$-$Ga_{1-x}As$ multi-layer film structure can be provided, in whose active layer film plane 16 the crystal mixture ratio x varies, as illustrated in FIG. 3. To give the particulars of the $Al_xGa_{1-x}As$ multi-layer film structure shown in FIG. 3, the n-GaAs substrate 11 has a plane direction of (100) and is doped with Te to $2 \times 10^{18}$ $cm^{-3}$; the n-$Al_{0.35}Ga_{0.65}As$ film 12 is also doped with Te to $2 \times 10^{18} cm^{-3}$; the $Al_xGa_{1-x}As$ film (active layer) 16, in which the crystal mixture ratio x is uniform in the Y direction (<110>) and monotonously increases from 0 to 0.1 in the X direction, is not doped; the p-$Al_{0.35}Ga_{0.65}As$ film 17 is doped with Ge to $1 \times 10^{18}$ $cm^{-3}$, and the p-GaAs film 18 is doped with Ge to $2 \times 10^{18}$ $cm^{-3}$. The epitaxial layers are 2 microns, 0.2 microns, 1 micron, and 1 micron thick in the order of reference thereto.

Figure 4:
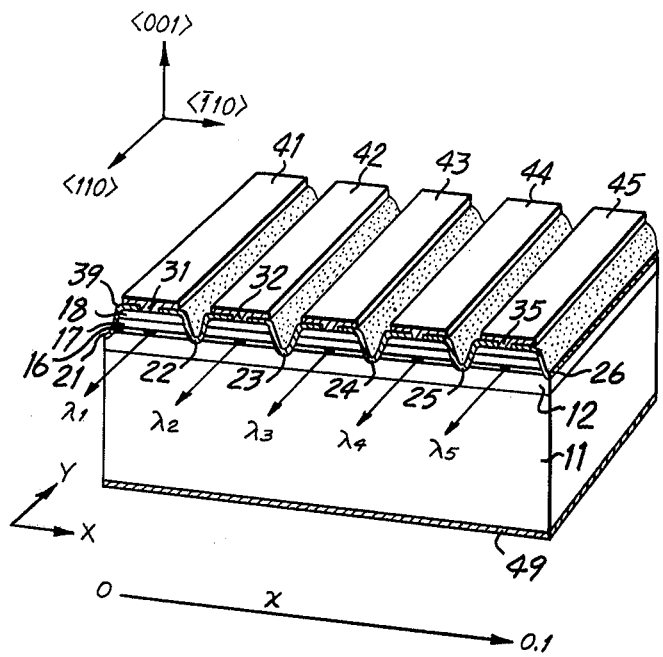
FIG. 4 is a perspective view of a first embodiment of this invention.

As shown in FIG. 4, on top of the multi-layer film structure of FIG. 3 are provided, at approximately 250-micron intervals, element-spacing grooves 21 through 26 which extend in the Y direction and whose depths reach the n-$Al_{0.35}Ga_{0.65}As$ film 12. Over the grooves is laid a silicon dioxide ($SiO_2$) film 39 leaving open 10-micron wide current-injecting stripe regions 31 through 35 (33 and 34 are not marked in the drawing), the film 39 being further overlaid with Au-Zn electrodes 41 through 45. An n-side electrode 49 is made of Au-Ge-Ni. The cavity surface is cleaved out on the (110) plane which is normal to the Y-direction, and is about 300 micron long in the direction of the oscillating axis (the direction of the Y axis).

In the semiconductor laser array obtained as described above, the five LDs which are composed on the substrate, independent of each other, by the element-spacing grooves 21 through 26 can be independently operated by currents supplied through the p-side electrodes, and moreover, the crystal mixture ratio x of AlAs of the active layer in the current-injecting region differs from one to another of the five LDs, whose light-emitting wavelengths $\lambda_1$ through $\lambda_5$ are, in the order of their arrangement, 856 nm, 843 nm, 831 nm, 820 nm and 809 nm, and are thus spaced at about 10-nm intervals. Accordingly, this embodiment can be used as a semiconductor laser array capable of five-wavelength multiplex transmission in a wavelength-division multiplex transmission system.

This embodiment uses a crystal mixture ratio (x) range of 0 to 0.1. If this range is extended to near 0.3, it will correspond to a wavelength range of approximately 860 to 700 nm making possible the division into at least 15 wavelengths, spaced at 11 nm on the average. Therefore, a wavelength-division multiplex transmission system using such laser diodes would be highly desirable for practical use.

Figure 5:
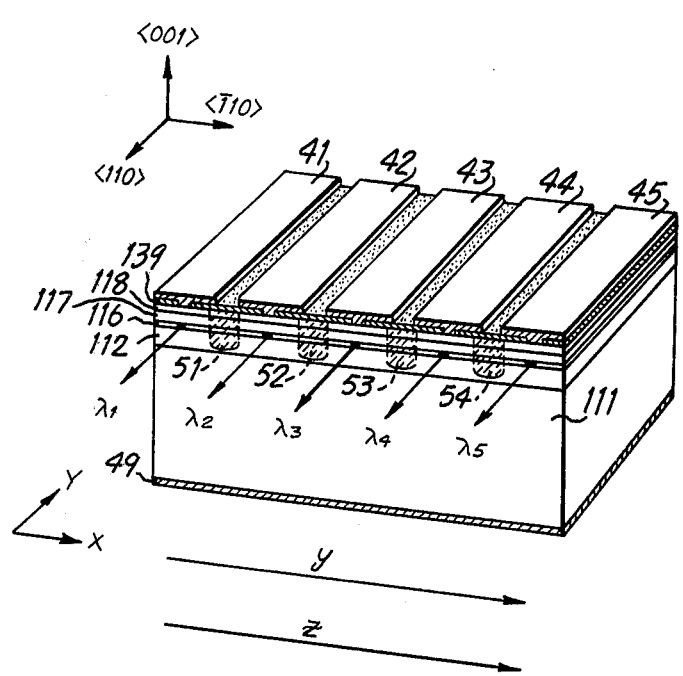
FIG. 5 is a perspective view of a second embodiment of this invention.

As shown in FIG. 5, after an n-InP layer 112, which will constitute a first cladding layer, is formed by the MBE technique on an n-InP substrate 111, an $In_yGa_{1-y}As_zP_{1-z}$ layer 116 is epitaxially grown over the substrate in a similar composition to that illustrated in FIG. 2. The band gap energy Eg in the $In_yGa_{1-y}As_zP_{1-z}$ layer 116, while remaining uniform in the Y direction, is varied from 1.20 to 0.75 eV by shifting the n-InP substrate 111 while smoothly changing the proportions of molecular beams In and P, used instead of Al among the molecular beams 80 of FIG. 2, from y=0.92, z=0.19 to y=0.58, z=0.93. In an InGaAsP multi-layer structure prepared by forming, by the MBE process, a p-InP film 117, which will constitute a second cladding layer, and a p-$In_{0.75}Ga_{0.25}As_{0.44}P_{0.56}$ film 118 on the $In_yGa_{1-y}As_zP_{1-z}$ layer, there are formed proton radiation-insulated regions 51 through 54 whose lower portions extend into the n-InP film 112. The subsequent procedure is similar to that used in the first embodiment. That is, an $SiO_2$ film 139, leaving 10-micron wide current-injecting strip regions, Au-Zn electrodes 41 through 45, and an n-side electrode 49, made of Au-Ge-Ni are successively arranged on the sample, as shown in FIG. 5. A cavity formed by cleaving the (110) plane, again is about 300 μm long. The laser array formed in this manner differs from the first embodiment in its use of the InGaAsP crystal whose light-emitting wavelengths fall within a 1-micron range and in that, as referred to above, it achieves separation between the LD elements by means of the proton radiation-insulated regions 51 through 54, this planar-type structure of FIG. 5 is easier to produce than the mesa-type structure of the first embodiment.

The light-emitting wavelengths $\lambda_1$ through $\lambda_5$ produced in this embodiment are, in the order of arrangement, 1100 nm, 1200 nm, 1300 nm, 1400 nm and 1500 nm, spaced at about 100-nm intervals. Like the first embodiment, the embodiment of FIG. 5 can provide a laser source multiplexing at least 15 wavelengths by the proper choice of the crystal mixture ratio.

As these embodiments clearly reveal, the present invention permits integration on the same substrate of a plurality of semiconductor lasers differing in wavelength over a much wider range of wavelengths than could be achieved by the prior art.

Figure 6:
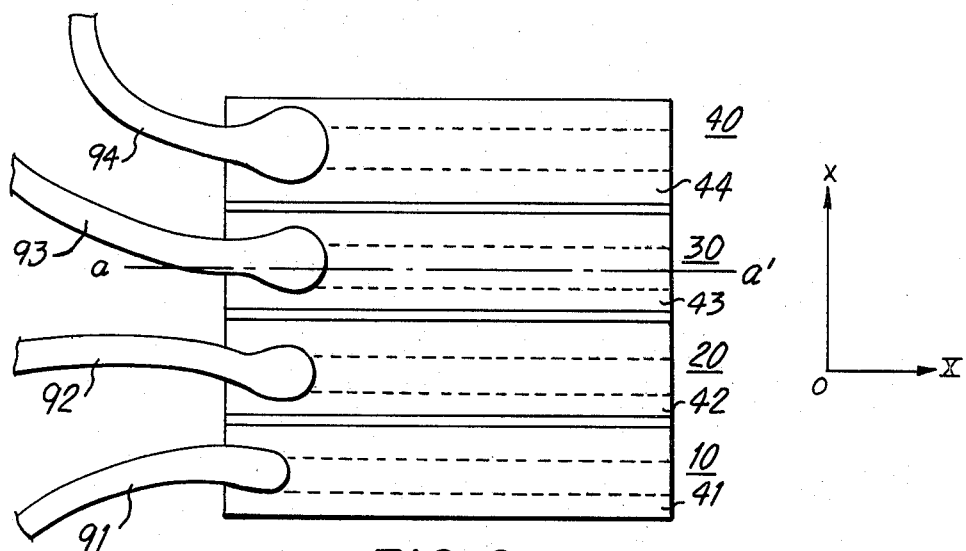
FIG. 6 is a plan view of an integrated laser array according to a third embodiment of this invention.
Figure 7:
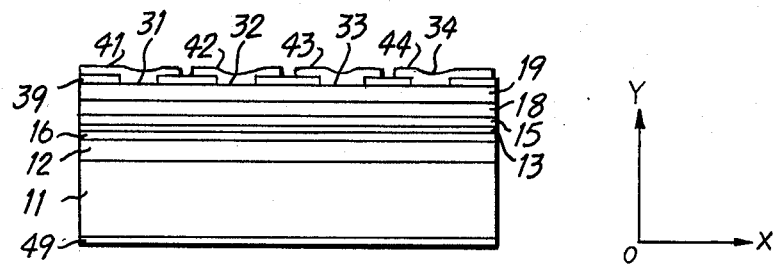
FIG. 7 is a side view of an integrated laser array according to the third embodiment of this invention.
Figure 8:
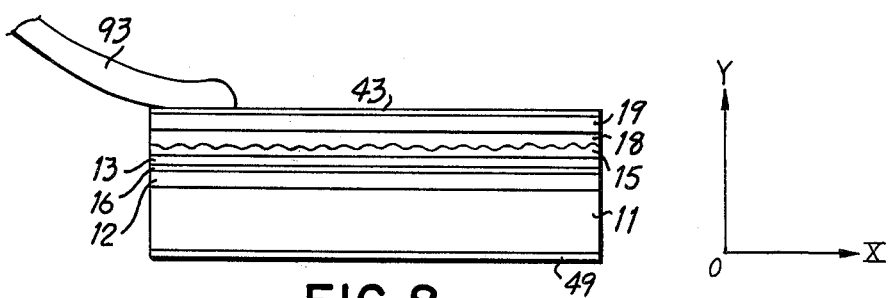
FIG. 8 is a sectional view cut along the a—a' line of an integrated laser array according to FIG. 6.

Now referring to the embodiment of the invention illustrated in FIGS. 6 through 8, after consecutively growing in the same manner as in the first embodiment, an n-$Al_{0.35}Ga_{0.65}As$ film 12 which will constitute a first cladding layer, an $Al_xGa_{1-x}As$ film 16, which constitutes an active layer in which x will gradually vary in one direction, a p-$Al_{0.15}Ga_{0.85}As$ film 13, which constitutes a barrier layer, and a p-$Al_{0.07}Ga_{0.93}As$ film 15, which constitute a waveguide layer on an n-GaAs substrate 11. The thickness of the p-$Al_{0.07}Ga_{0.93}As$ film 15 is periodically varied by photolithography, a well-known technique utilizing the interference of laser light, and chemical etching. Thereafter, a p-$Al_{0.3}Ga_{0.7}As$ film 18, which constitutes a second cladding layer and a p-GaAs layer 19 are grown by a liquid phase epitaxial method, and over them are formed first to fourth p-side electrodes 41, 42, 43 and 44 through an $SiO_2$ insulator film 39 having first through fourth stripe regions 31, 32, 33 and 34. On the other side of the n-GaAs substrate 11 is formed an n-side electrode 49. First through fourth leadwires 21, 22, 23 and 24 are respectively attached to the first through fourth electrodes 41, 42, 43 and 44, and electric currents are supplied through first through fourth current-injecting stripe regions 31, 32, 33 and 34 by applying voltages between the lead wires, and the n-side electrode 49 will generate a gain in the active layer consisting of the p-Al$_x$Ga$_{1-x}$As film 16. Since confinement of light is accomplished in the structure of FIGS. 6-8 by the Al$_x$Ga$_{1-x}$As film 16, which is the active layer, the p-Al$_{0.15}$Ga$_{0.85}$As film 13, and the p-Al$_{0.07}$Ga$_{0.93}$As film 15, and that of the carrier by the Al$_x$Ga$_{1-x}$As film 16, which results in what is known as separate confinement of the carrier and light, there can be achieved efficient light feedback with little leakage of carriers into the periodic structure parts.

Figure 9:
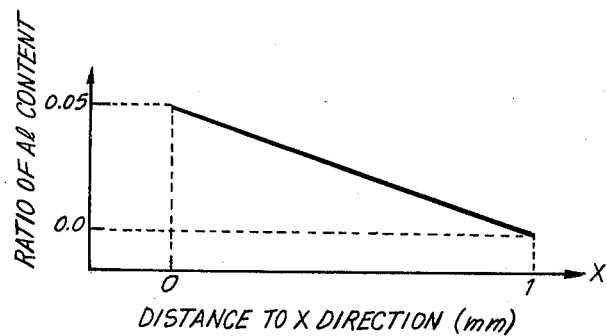
FIG. 9 is a graph illustrating how the crystal mixture ratio x of AlAs varies in the X direction within the film plane.

Whereas the thickness of the p-Al$_{0.07}$Ga$_{0.93}$As film 15 is periodically varied as illustrated in FIG. 8, its periods are set at 0.311 micron, 0.315 micron, 0.319 micron and 0.323 micron under the first through fourth current-injecting stripe regions 31, 32, 33 and 34, respectively. This arrangement utilizes Bragg diffraction by the periodic structure for light feedback, and the wavelengths in a vacuum satisfying the Bragg conditions of third order diffraction are respectively 0.83 micron, 0.84 micron, 0.85 micron and 0.86 micron, taking into account the equivalent refractive indices of the light waveguides including the active layer. Since, on the other hand, the Al content x of the p-Al$_x$Ga$_{1-x}$As film 16 is varied substantially uniformly from x=0.05 to x=0.0 in the (X) direction normal to the lengthwise directions of the first through fourth current-injecting stripe regions 31, 32, 33 and 34, as illustrated in FIG. 9, the central wavelengths of the gains of the active layer immediately underneath the first through fourth stripe-shaped regions are about 0.83 micron, 0.84 micron, 0.85 micron and 0.86 micron, respectively.

Thus, in this embodiment, each of these central wavelengths is substantially identical with the wavelengths satisfying the Bragg conditions of the periodic structure, making it possible to integrate on the same substrate first through fourth semiconductor lasers 10, 20, 30 and 40, which are almost equal to one another in oscillation threshold value and efficiency. In this embodiment, the energy band gap of the active layer is altered by changing its Al content, and the central wavelengths of the gains are thereby varied to a considerable extent. By matching the wavelengths satisfying the Bragg conditions of distributed feedback with the central wavelengths of the gains, a plurality of semiconductor lasers, differing in wavelength over a wide range, are successfully integrated on the same substrate. Because distributed feedback is used for laser oscillation, the oscillating wavelengths are well controlled and highly stable.

Figure 10:
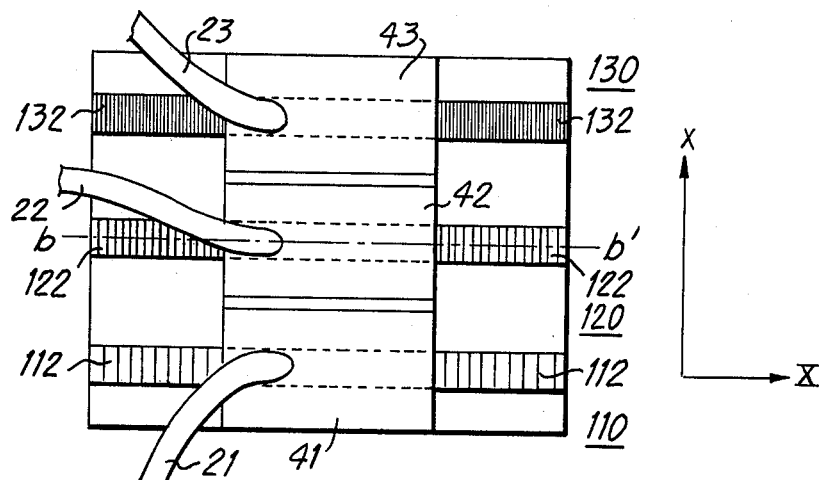
FIG. 10 is a plan view of an integrated laser array according to a fourth embodiment of this invention.
Figure 11:
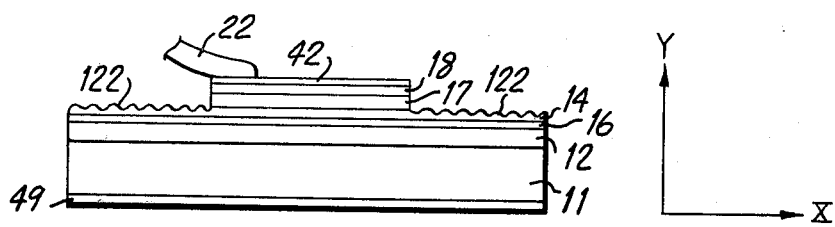
FIG. 11 shows a sectional view cut along the b—b' line of FIG. 10.
Figure 12:
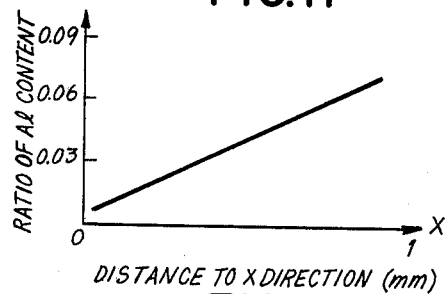
FIG. 12 is a graph illustrating how the crystal mixture ratio x of AlAs varies in the X direction within the film plane.

The embodiment of the invention illustrated in FIGS. 10 and 11, includes an n-Al$_{0.3}$Ga$_{0.7}$As film 12 which constitutes a first cladding layer, a p-Al$_x$Ga$_{1-x}$As film 16 which constitutes an active layer, a p-Al$_{0.1}$Ga$_{0.9}$As layer 14 to constitute a waveguide layer, a p-Al$_{0.3}$Ga$_{0.7}$As film to constitute a second cladding layer, and a p-GaAs film 18, all grown on one side of an n-GaAs substrate 11 by the same technique as in the third embodiment. Large parts of the p-Al$_{0.3}$Ga$_{0.7}$As film 17 and the p-GaAs film 18 are removed by chemical etching to expose the p-Al$_{0.1}$Ga$_{0.9}$As film 14, to whose exposed parts are attached first through third Bragg reflectors 112, 122 and 132 extending in the Z direction by the same method as described with reference to the third embodiment. Also provided are first through third p-side electrodes 41, 42 and 43 and an n-side electrode 49. The first through third Bragg reflectors 112, 122 and 132 are stripes or undulations having periods of 0.357 micron, 0.350 micron and 0.343 micron, respectively, and are arranged in parallel to each other in the Z direction on the p-Al$_{0.1}$Ga$_{0.9}$As film 14. The wavelengths satisfying their third-order Bragg diffractions are 0.857 micron, 0.840 micron and 0.824 micron, respectively. Because the Al content X of the p-Al$_x$Ga$_{1-x}$As layer 16 is varied substantially uniformly from 0.005 to 0.06 in the X direction, as illustrated in FIG. 7, the forbidden bandwidth of layer 16 varies almost evenly from 1.440 eV to 1.498 eV, again in the X direction, and the central wavelengths of the gains of the p-Al$_x$Ga$_{1-x}$As layer 16 immediately beneath the first through third p-side electrodes 41, 42, 43 are approximately 0.857 micron, 0.840 micron and 0.824 micron, respectively. By applying a voltage between a first lead wire 21 and the n-side electrode 49 to make a current flow, a first semiconductor laser 110, composed of the part of the active layer immediately underneath the first electrode 41 and the first Bragg reflector 112, is enabled to oscillate at a wavelength of 0.857 micron. Similarly, second and third semiconductor lasers 120 and 130 are able to oscillate at 0.840 micron and 0.857 micron, and are successfully integrated on the same substrate semiconductor lasers differing in oscillating wavelength over a wide range extending from 0.824 micron to 0.857 micron. Because of the use of the Bragg reflectors, the oscillating wavelengths of the lasers are highly controllable and stable.

In the third and fourth embodiments, as already stated with reference to the second embodiment, it is also possible to integrate on the same substrate a plurality of semiconductor lasers whose wavelengths are controlled over a wide range by the use of the InP crystal and the In$_y$Ga$_{1-y}$As$_z$P$_{1-z}$ active film, the relative proportions of y and z being gradually varied in one direction.

In addition, the layer on which the periodic structure for distributed feedback is to be formed need not be farther from the substrate of the active layer is in the illustrated embodiments, but can also be closer to, or even in contact with, the substrate.

As thus far described in detail with reference to the third and fourth embodiments, the present invention makes it possible to integrate on the same substrate a plurality of semiconductor lasers differing in wavelength over a wide range by combining an active layer, whose forbidden bandwidth is spatially varied, with a periodic distributed-feedback structure, wherein the direction of light feedback is set perpendicular to the direction of the forbidden bandwidth variation and the periods are so selected as to make the wavelengths at which the light feedback takes place approximately equal to the central wavelengths of the gains of the active layer.

Figure 13:
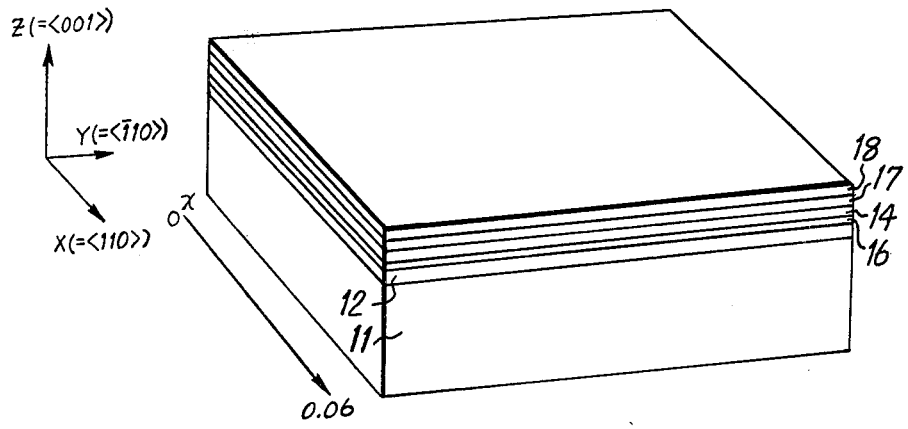
FIG. 13 is a perspective view of the $Al_xGa_{1-x}As$ multi-layer film structure for use in an integrated laser array according to a fifth embodiment of this invention.

FIG. 13 shows a perspective view of an Al$_x$Ga$_{1-x}$As multilayer film structure for use in a fifth embodiment of the present invention, which is epitaxially grown by the LPE technique. The structure illustrated in FIG. 3 includes an n-GaAs substrate 11, which has a plane direction of (100) (doped with Si to $2 \times 10^{18}$ cm$^{-3}$); an n-Al$_{0.35}$Ga$_{0.65}$As film 12 (doped with Te to $1 \times 10^{18}$ cm$^{-3}$); an Al$_x$Ga$_{1-x}$As film wherein 16 in which the crystal mixture ratio x of AlAs is constant in the Y direction (= <$\bar{1}10$>) in the figure and monotonously increases from 0 to 0.06 in the X direction (non-doped); a p-Al$_{0.1}$Ga$_{0.9}$As film 14 (doped with Ge to $8 \times 10^{17}$ cm$^{-3}$); a p-Al$_{0.35}$Ga$_{0.65}$As film 17 (doped with Ge to $1 \times 10^{18}$ cm$^{-3}$), and an n-GaAs film 18 (doped with Sn to $5 \times 10^{17}$ cm$^{-3}$). Film 12 is 3 microns in thickness, film 16 is 0.2 micron, film 14 is 0.8 micron, film 17 is 1 micron, and film 18 is 1 micron.

Figure 14:
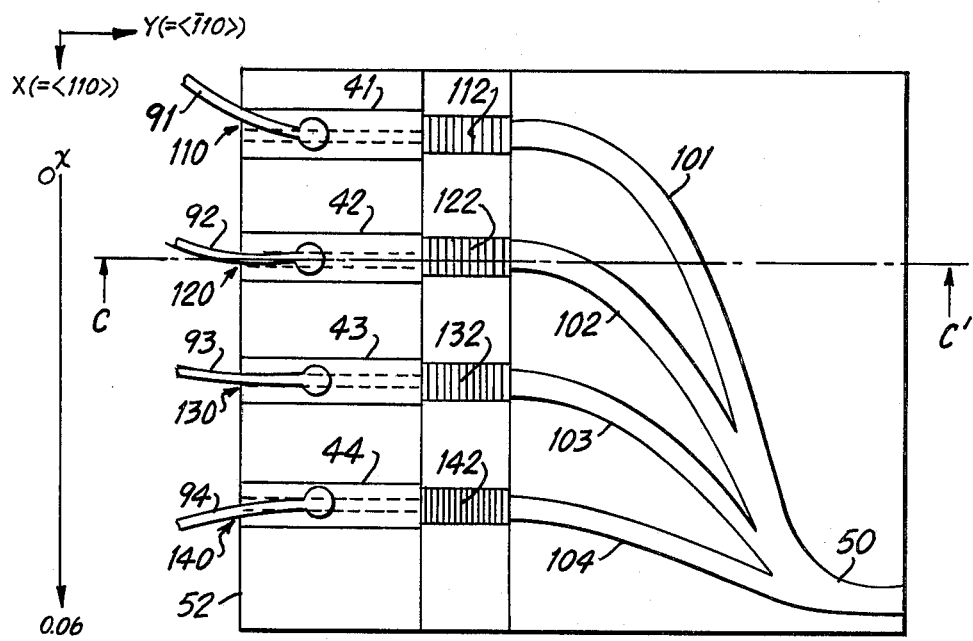
FIG. 14 is a plan view of the fifth embodiment of this invention.
Figure 15:
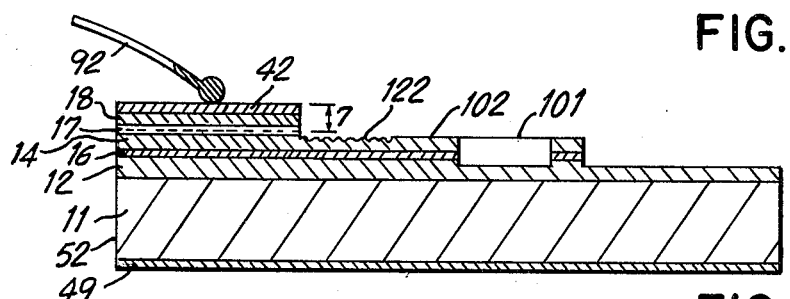
FIG. 15 is a sectional view cut along the c—c' line of FIG. 14.

FIGS. 14 and 15 illustrate an integrated laser array according to a fifth embodiment of this invention wherein the $Al_xGa_{1-x}As$ multi-layer film structure shown in FIG. 13 is used to form four distributed-reflection type LDs and a light focusing waveguide section on the same substrate. In manufacturing process of this embodiment, the $Al_xGa_{1-x}As$ multi-layer film structure illustrated in FIG. 13, is first covered with an approximately 5,000 Å thick $SiO_2$ film, which is then etched selectively in 10-micron widths in the Y direction such that four stripes (indicated by the dotted lines in FIG. 14) are formed in parallel in the X direction at 200-micron intervals. These stripe parts are then selectively subjected to Zn diffusion until the diffusion fronts reach the $p-Al_{0.35}Ga_{0.65}As$ layer 17—the part referred to by 7 in FIG. 15 is the Zn-diffused region. Next, four Cr-Au electrodes 41 through 44 are vacuum evaporated onto these strips for current injection. Then to form diffraction grating and waveguide parts, the $p-Al_{0.35}Ga_{0.65}As$ and upper layers are wholly etched except in the electrode part. Diffraction gratings 112 to 142 are so formed on the $p-Al_{0.07}Ga_{0.93}As$ layer 14, by conventional techniques of photolithography and chemical etching, that the periods of the diffraction gratings are 0.365 micron, 0.360 micron, 0.356 micron and 0.352 micron respectively corresponding to the electrodes 41 through 44, each diffraction grating being about 100 microns long. Waveguides 101 through 104 and a waveguide connection 50 are then formed by mesa-etching the $p-Al_{0.07}Ga_{0.93}As$ layer 14 and $Al_xGa_{1-x}As$ layer 16, leaving a 20-micron width of each layer, until the $n-Al_{0.35}Ga_{0.65}As$ layer 12 is reached. Next, after grinding the substrate from the n-GaAs 11 side until its overall thickness is the reduced to about 80 microns, Au-Ge-Ni is vacuum-evaporated thereon as n-side electrode 49, followed by about one minute of heat treatment in a hydrogen atmosphere of 400° C. The substrate is then cleaved in the <110> direction to reduce the lengths of the electrodes 41 through 44 to about 300 microns—the cleaved facet 52 thereby formed is used as the resonator surface of the lasers. The end face of the waveguide connection 50 is also cleaved out, and lead wires 91 through 94 are attached to the p-side electrodes 41 through 44, respectively.

In the semiconductor layer array structured of FIGS. 14 and 15 four distributed-reflection type LDs 110, 120, 130 and 140, each forming an oscillator with a reflector resulting from the cleavage of one side and the diffraction grating on the other, generate oscillation by applying a voltage between the p-side electrodes 41 through 44 and the n-side electrode 49 through the lead wires 91 through 94. As the crystal mixture ratio x of AlAs in the active layer 16 substantially uniformly varies from x=0 to x=0.06 in the X direction, the central wavelengths of the gains of the distributed-reflection type LDs 110, 120, 130 and 140 in their active layer regions are 0.86 micron, 0.85 micron, 0.84 micron and 0.83 micron, respectively, in vacuum. The diffraction gratings 112, 122, 132 and 142, taking into account the equivalent refractive indices including those of the active layer, are formed to have periods satisfying the Bragg conditions of third-order diffraction with respect to the central wavelength of the gain in the active region of each. Therefore, the four distributed-reflecton-type LDs 110, 120, 130 and 140 have oscillating wavelengths of 0.86 micron, 0.85 micron, 0.84 micron and 0.83 micron, respectively, and are virtually equal in their oscillation threshold value and efficiency. The output light rays from the four distributed-reflection type LDs 110, 120, 130 and 140 are coupled to the four waveguides 101 through 104. Each waveguide is curved in the increasing direction of the crystal mixture ratio x of AlAs in the active layer 16, and the four waveguides are combined into one at the waveguide connection 50. Accordingly, light rays that have entered the waveguides 101 through 104 from the distributed reflection type LDs 110, 120, 130 and 140 are guided within the film plane of the active laser 16 in the increasing direction of the crystal mixture ratio x of AlAs in the active layer 16, i.e., in the increasing direction of bandgap energy, and, because the band gap energy of the waveguide layer is greater than the energy of the photons of the guided light rays, there is little loss of light owing to absorption by the waveguide layer.

Although the waveguides of this embodiment have been described as being formed by mesa etching, this is not the only applicable technique; the waveguides can also be formed by proton irradiation, Zn diffusion, or buried crystal growth. Further, the distributed-reflection type LDs can be replaced with distributed-feedback type LDs. Still further, although the crystal mixture x of AlAs in the $Al_xGa_{1-x}As$ film 16, which constitutes the active layer and waveguide layer, is described as monotonously increasing or decreasing in one direction in this embodiment, this film can as well be varied in some other manner, for instance, to have its peak near the central part. In this case, however, the waveguide connection will have to be formed in the vicinity of the peak of x.

The applicable semiconductor materials are not limited to the $Al_xGa_{1-x}As$ system used in the last mentioned embodiment, but others including the $In_yGa_{1-y}As_zP_{1-z}$ system are also usable. As already stated, where the $In_yGa_{1-y}As_zP_{1-z}$ system is used, the band gap energy can be varied over a wider range than with the $Al_xGa_{1-x}As$ system by selecting a proper combination of y and z for satisfactory lattice-matching with the InP substrate.

As is apparent from the foregoing description of several embodiments of the invention, the present inventon makes it possible to form on the same substrate a plurality of LDs differing in oscillating wavelength over a wide range and a waveguide section capable of letting output light rays from the LDs to a single launching terminal with little loss by the use of a semiconductor film within whose plane the bandgap energy varies as the active layer of the LDs and as waveguide layer for output light from the LDs. Accordingly, since the light source has common launching terminals on the same substrate, wavelength-multiplexed emanating light rays can be readily coupled to an optical fiber without the need for any other special means for wavelength multiplexing. In addition, not only is the performance of the invention as light sources for optical fiber wavelength-division multiplex transmission system improved, but also the manufacture of elements requires only one epitaxial growth step, with the result that the elements can be more readily produced in fewer manhours than by was possible in the prior art. Thus, there is a major economic effect as well.

Figure 16:
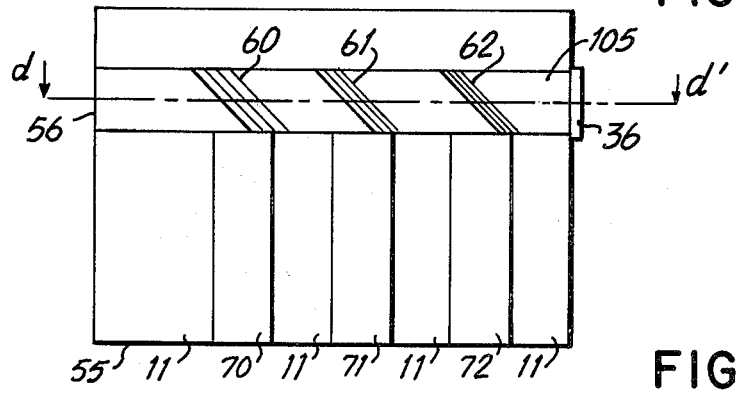
FIG. 16 is a plan view of an integrated laser array according to a sixth embodiment of this invention.
Figure 17:
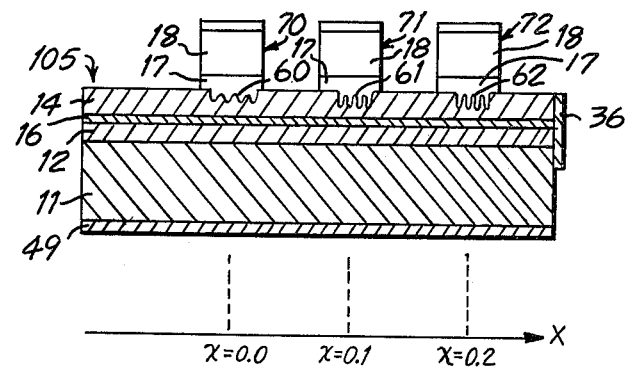
FIG. 17 is a sectional view cut along the d—d' line of FIG. 16.

With reference to FIGS. 16 and 17, a sixth embodiment of the present invention illustrated in FIGS. 16 and 17 uses an AlGaAs multi-layer structure similar to that of the fourth embodiment. Herein, mesa-type composite layers 70, 71 and 72 are formed in a direction perpendicular to the X direction, in which the crystal mixture ratio x of an active layer 16 increases. One end of the composite layer is a cleaved face 55 of the semiconductor crystal, and a light waveguide 105 is formed in the other end of the crystal in said X direction. One end of the light waveguide 105 is another cleaved face 56 of the crystal, and an absorber 36 is applied onto the cleaved face at the other end to absorb unneeded light. A diffraction grating is provided at the junction of the optical axis of each mesa-type composite layer and the light waveguide 105 in which the thickness of an $Al_{0.15}Ga_{0.85}As$ layer 14 periodically varies at an inclination of 45° to the optical axis. The light waveguide 105 is etched to the surface of the $Al_{0.15}Ga_{0.85}As$ layer 14. The techniques to form the diffraction gratings and electrodes are not described here, as they are the same as those already explained. The diffraction gratings 60, 61 and 62, whose respective periods are 0.291 micron, 0.314 micron and 0.337 micron, have high reflecting powers only to light rays having wavelengths of 0.74 micron, 0.80 micron and 0.86 micron, respectively, but transmit other light rays.

In this embodiment, when currents are injected into the composite layers 70, 71 and 72, the layers generate laser oscillation with cleaved faces 55 and 56 acting as reflective mirrors. The composition ratios x of the active $Al_xGa_{1-x}As$ layer 16, which is a constituent of the composite layers 70, 71 and 72, differ from each other, being 0.2, 0.1 and 0, respectively. Therefore, as is apparent from the foregoing description, oscillators, which contain one or another of the composite layers 70, 71 and 72, all have different wavelengths of laser oscillation, about 0.74 micron, 0.80 micron and 0.86 micron, respectively. This embodiment thus gives on the same axis oscillating light rays having different wavelengths which emanate from the end of the cleaved face 56.

In this embodiment, alternative relective means to the diffraction gratings can be provided by forming grooves perpendicular to the substrate face and at a 45° angle to the cleaved faces, and by burying therein materal with an appropriate refractive index to serve as translucent mirrors. In this case, however, because the reflective means have no wavelength selectively, the internal losses of the semiconductor lasers will be somewhat greater, with a corresponding drop in efficiency.

A number of variations are conceivable besides the above described basic embodiments of the present invention. First, by introducing into the vicinity of the active regions immediately underneath the stripe-shaped current-injecting regions a horizontal mode control structure, of which a number of versions have been devised, there will be obtained multi-wavelength light sources whose horizontal mode is controlled. Further, production can be achieved by either separate or combined application of the MBE and liquid phase growth techniques. The metal organic chemical vapor deposition (MOCVD) method would also be useful.

As hitherto described with reference to specific embodiments thereof, the present invention, according to which a plurality of semiconductor lasers are integrated on a semiconductor multi-layer film crystal containing an active layer in which the band gap energy varies in one direction, makes it possible to form on the same substrate a plurality of semiconductor lasers differing in their respective oscillating wavelengths over a far wider range than could be attained in conventional systems. The present invention thereby provides practically useful multi-wavelength light sources for optical wavelength-division multiplex transmission. Further in integrating an optical multiplexing device on the same substrate, the arrangement of a common light waveguide in the part where the bandgap energy is greater results in a multi-wavelength semiconductor laser array with a built-in optical multiplexing device, which is easy to manufacture and yet is highly efficient.

What is claimed is:

1. A monolithically integrated laser array capable of providing light rays of a plurality of wavelengths, said array comprising a semiconductor body having:
   a semiconductor substrate;
   a multi-layer structure formed on said substrate,
   said multi-layer structure comprising an active layer, a first cladding layer, and a second cladding layer separated from said first cladding laser by said active layer,
   said active layer being composed of a mixed crystal, the energy band gap of said active layer varying in a predetermined first direction of a plane lying in said active layer;
   means for electrically isolating regions of said multi-layer structure in parallel to a second directon perpendicular to said predetermined first direction and for providing a plurality of laser diodes;
   optical resonator means composed of two cleaved faces obtained by cleaving said semiconductor body perpendicularly to the direction of the optical axes of said laser diodes;
   said isolating means extending into said first cladding layer through said active and said second cladding layers; and
   means for supplying a voltage to forward bias each of said laser diodes.

2. The monolithically integrated laser array as claimed in claim 1, wherein one of said first and second cladding layers includes periodic structures having a prescribed pitch of thickness in the direction of said optical axis of each of said individual laser diodes,
   said prescribed pitch decreasing with the increase in energy band gap of said active layer.

3. The monolithically integrated laser array as claimed in claim 2, wherein said periodic structures constitute Bragg reflectors provided in the parts where both ends of said individual laser diodes have been etched to a depth reaching said second cladding layer.

4. The monolithically integrated laser array as claimed in claim 3, further comprising a cleaved face obtained by cleaving one end of said semiconductor body in a perpendicular direction to each of the optical axes of said laser diodes, said Bragg reflectors consisting of said periodic structure provided in prescribed positions relative to said cleaved face.

5. The monolithically integrated laser array, as claimed in claim 4, further comprising light waveguides connected to said periodic structures and a combined light waveguide unifying said separate light waveguides.

6. The monolithically integrated laser array as claimed in claim 5, wherein said combined light waveguide is formed in a region including an active layer whose energy band gap is greater than the other regions.

7. The monolithically integrated laser array as claimed in claim 1, further including light waveguides arranged at a prescribed distance from said first and second cleaved faces and in a perpendicular direction to each of said optical axes; third and fourth cleaved faces on both ends of said light waveguides obtained by cleaving said semiconductor body in a perpendicular direction to said first and second cleaved faces; reflective means provided on said fourth cleaved face; and periodic structures having a prescribed pitch of film thickness provided in one of said first and second cladding layers at the junctions of said optical axes, the axes of said light waveguides being at an inclination of 45° to said optical axes.

* * * * *

UNITED STATES PATENT AND TRADEMARK OFFICE
CERTIFICATE OF CORRECTION

PATENT NO. : 4,318,058
DATED : March 2, 1982
INVENTOR(S) : Ikuo Mito; Shigeo Matsushita; Kohroh Kobayashi.

It is certified that error appears in the above-identified patent and that said Letters Patent are hereby corrected as shown below:

IN THE CLAIMS

Claim 1, line 17, column 12, change "laser" to

-- layer --.

Signed and Sealed this

Eighth Day of June 1982

|SEAL|

Attest:

GERALD J. MOSSINGHOFF

Attesting Officer    Commissioner of Patents and Trademarks